(12) United States Patent
Kim

(10) Patent No.: US 7,659,133 B2
(45) Date of Patent: Feb. 9, 2010

(54) METHOD FOR MANUFACTURING CMOS IMAGE SENSOR

(75) Inventor: Sung Moo Kim, Seongnam-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 262 days.

(21) Appl. No.: 11/646,096

(22) Filed: Dec. 26, 2006

(65) Prior Publication Data

US 2007/0155041 A1 Jul. 5, 2007

(30) Foreign Application Priority Data

Dec. 28, 2005 (KR) .................. 10-2005-0132782

(51) Int. Cl.
*H01L 21/00* (2006.01)
*H01L 21/8238* (2006.01)

(52) U.S. Cl. .................. 438/59; 438/73; 438/200; 438/231; 438/237; 257/E21.634; 257/E21.636

(58) Field of Classification Search .................. 257/204, 257/274; 438/153, 188, 199–233, 59, 73, 438/237, E21.634, E21.636
See application file for complete search history.

(56) References Cited

U.S. PATENT DOCUMENTS

| | | | | |
|---|---|---|---|---|
| 6,194,258 B1 * | 2/2001 | Wuu | .......................... | 438/200 |
| 6,541,329 B1 | 4/2003 | Chen et al. | | |
| 6,642,076 B1 * | 11/2003 | Yaung et al. | .................. | 438/48 |
| 6,737,291 B1 * | 5/2004 | Lim | ........................... | 438/45 |
| 7,361,542 B2 * | 4/2008 | Shim | .......................... | 438/200 |
| 2007/0072325 A1 * | 3/2007 | Rhodes | ........................ | 438/48 |

OTHER PUBLICATIONS

Chinese Office Action; Application No. 200610156706.2; Dated: Apr. 18, 2008; The State Intellectual Property Office of the People's Republic of China.
Chinese Office Action with English Translation; Application No. 200610156706.2; Dated: Apr. 3,2009; The State Intellectual Property Office of P.R.C., People's Republic of China.

* cited by examiner

*Primary Examiner*—Evan Pert
(74) *Attorney, Agent, or Firm*—The Law Offices of Andrew D. Fortney; Andrew D. Fortney

(57) ABSTRACT

Disclosed is a method for manufacturing a CMOS image sensor, capable of preventing dopants implanted with high energy from penetrating into a lower part of a gate electrode when a photodiode is formed, thereby preventing current leakage of a transistor and variation of a threshold voltage. The method includes the steps of forming a gate electrode on a transistor area of a first conductive type semiconductor substrate including a photodiode area and the transistor area, forming a salicide layer on the gate electrode, and implanting second conductive type dopants for forming a photodiode in a photodiode area of the semiconductor substrate.

16 Claims, 3 Drawing Sheets

METHOD FOR MANUFACTURING CMOS IMAGE SENSOR

This application claims the benefit of Korean Application No. 10-2005-0132782, filed on Dec. 28, 2005, which is incorporated by reference herein in its entirety.

BACKGROUND OF THE INVENTION

1. Field of the Invention

The present invention relates to a method for manufacturing a CMOS image sensor. More specifically, the present invention relates to a method for manufacturing a CMOS image sensor, capable of preventing dopants implanted with high energy from penetrating into a lower part of a gate electrode when a photodiode is formed, thereby preventing current leakage of a transistor and variation of a threshold voltage.

2. Description of the Related Art

In general, an image sensor is a semiconductor device for converting optical images into electric signals, and is classified into a charge coupled device (CCD) and a CMOS image sensor.

The CCD has a plurality of photodiodes (PDs), which are arranged in the form of a matrix in order to convert optical signals into electric signals. The CCD includes a plurality of vertical charge coupled devices (VCCDs) provided between photodiodes vertically arranged in the matrix so as to transmit electrical charges in the vertical direction when the electrical charges are generated from each photodiode, a plurality of horizontal charge coupled devices (HCCDs) for transmitting the electrical charges that have been transmitted from the VCCDs in the horizontal direction, and a sense amplifier for outputting electric signals by sensing the electrical charges being transmitted in the horizontal direction.

However, such a CCD has various disadvantages, such as a complicated drive mode, high power consumption, and so forth. Also, the CDD requires multi-step photo processes, so the manufacturing process for the CCD is complicated. In addition, since it is difficult to integrate a controller, a signal processor, and an analog/digital converter (A/D converter) onto a single chip of the CCD, the CCD is not suitable for compact-size products.

Recently, the CMOS image sensor is spotlighted as a next-generation image sensor capable of solving the problem of the CCD. The CMOS image sensor is a device employing a switching mode to sequentially detect an output of each unit pixel by means of MOS transistors, in which the MOS transistors are formed on a semiconductor substrate corresponding to the unit pixels through a CMOS technology using peripheral devices, such as a controller and a signal processor. That is, the CMOS sensor includes a photodiode and a MOS transistor in each unit pixel, and sequentially detects the electric signals of each unit pixel in a switching mode to realize images.

Since the CMOS image sensor makes use of the CMOS technology, the CMOS image sensor has advantages such as the low power consumption and simple manufacturing process with a relatively smaller number of photo processing steps. In addition, the CMOS image sensor allows the product to have a compact size, because the controller, the signal processor, and the A/D converter can be integrated onto a single chip of the CMOS image sensor. Therefore, CMOS image sensors have been extensively used in various applications, such as digital still cameras, digital video cameras, and so forth.

Hereinafter, a method for manufacturing a conventional CMOS image sensor will be described.

FIGS. 1A to 1C are sectional views showing the conventional CMOS image sensor.

As shown in FIG. 1A, a low-density P type (P-) epitaxial layer 110 is formed on a P type semiconductor substrate 100. Then, an exposure and development process is performed with respect to the resultant structure by using a mask defining an active area and an isolation area, and the epitaxial layer 110 formed in the isolation area is etched to a predetermined depth, thereby forming a trench. An $O_3$ TEOS film is formed on the semiconductor substrate 100 such that the $O_3$ TEOS film is filled in the trench, and then is patterned through a chemical mechanical polishing (CMP) process such that the $O_3$ TEOS film remains only in the trench, thereby forming an isolation layer 120 in the isolation area.

Then, an insulating layer and a conductive layer are sequentially formed on the entire surface of the semiconductor substrate 100, and then selectively removed, thereby forming a gate electrode 140 and a gate insulating layer 130.

Subsequently, a photoresist pattern (not shown) is formed such that only a portion of the epitaxial layer 110 corresponding to a source/drain area is exposed, and low-density N type dopants are implanted into the resultant structure, thereby forming a low-density N type impurity area for lightly doped drain (LDD).

As shown in FIG. 1B, a photoresist film (not shown) is deposited on the entire surface of the semiconductor substrate, and then an exposure and development process is performed with respect to the resultant structure, thereby forming a photoresist pattern such that a photodiode area is exposed. At this time, the photoresist pattern allows a portion of the gate electrode 140 to be exposed. Then, N type dopants are implanted into the epitaxial layer 110 formed in the photodiode area through a high-energy ion implantation process, and a diffusion process is performed, thereby forming an N type impurity diffusion area 160. Thereafter, the photoresist pattern is removed.

As shown in FIG. 1C, an insulating layer is deposited on the entire surface of the semiconductor substrate, and an etch back process is performed with respect to the resultant structure, thereby forming spacers 170 at both sides of the gate electrode 140. Subsequently, a photoresist pattern (not shown) is formed such that the spacer formed in a source/drain area or in the vicinity of the source/drain area can be exposed, and then high-density N type dopants are implanted into an upper part of the source/drain area, thereby forming a high-density N type impurity area 180. In addition, a photoresist pattern (not shown) is formed such that the spacer formed in the photodiode area or in the vicinity of the photodiode area can be exposed, and then P type dopants are implanted into an upper part of the N type impurity diffusion area 160, thereby forming a photodiode P type impurity diffusion area 190.

However, during the high-energy N type dopant implantation process for forming a photodiode, N type dopants may be doped to a channel area at a lower part of the gate insulating layer 130 through the gate electrode 140 due to high-energy ion implantation.

In other words, since the N type dopants are doped to the extent of the channel area formed below the gate electrode 140, a threshold value Vth of a transistor is reduced to a level equal to or less than a target value, so an off leakage current may increase.

SUMMARY OF THE INVENTION

The present invention has been made to solve the above problem(s), and therefore, it is an object of the present invention to provide a method for manufacturing a CMOS image sensor, capable of preventing dopants implanted with high energy from penetrating into a lower part of a gate electrode when a photodiode is formed, thereby reducing or preventing current leakage of a transistor and variation of a threshold voltage.

In order to accomplish the object of the present invention, there is provided a method for manufacturing a CMOS image sensor, the method including the steps of forming a gate electrode on a transistor area of a first conductivity type semiconductor substrate including a photodiode area and the transistor area, forming a salicide layer on the gate electrode, and implanting second conductivity type dopants for forming a photodiode in a photodiode area of the semiconductor substrate.

Preferably, the step of implanting the second conductivity type dopants includes the sub-steps of depositing a photoresist film on an entire surface of the semiconductor surface including the salicide layer, patterning the photoresist film such that the photodiode area of the semiconductor substrate and a portion of the salicide layer adjacent to the photodiode area are exposed, and implanting second conductivity type dopants into the exposed photoodiode area by using the patterned photoresist film and the exposed portion of the salicide layer a mask.

DETAILED DESCRIPTION OF THE INVENTION

Hereinafter, a method for manufacturing a CMOS image sensor according to the present invention will be described in detail with reference to accompanying drawings.

Figure 1A:
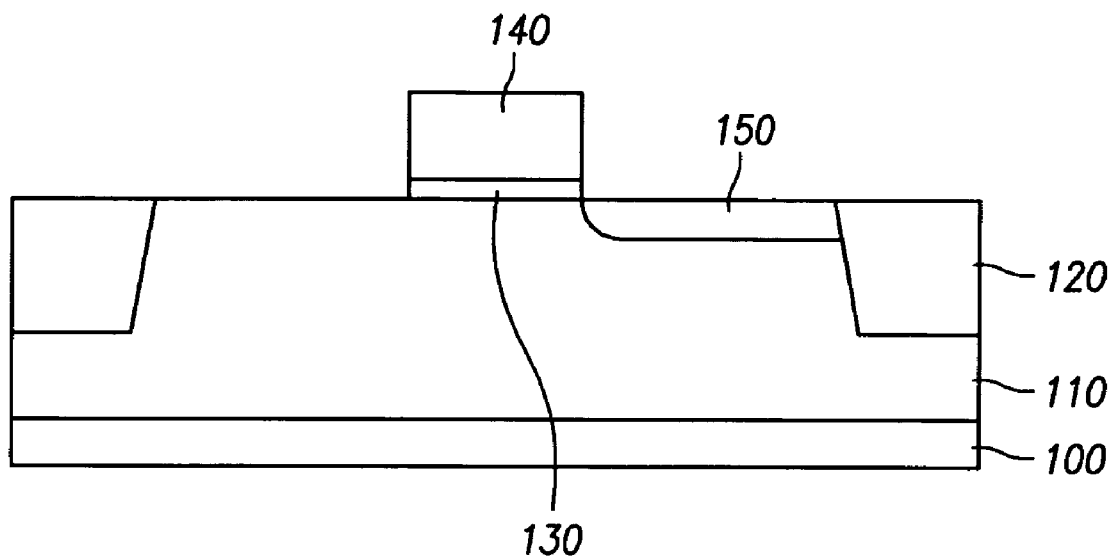
FIGS. 1A to 1C are sectional views showing a conventional CMOS image sensor.
Figure 1B:
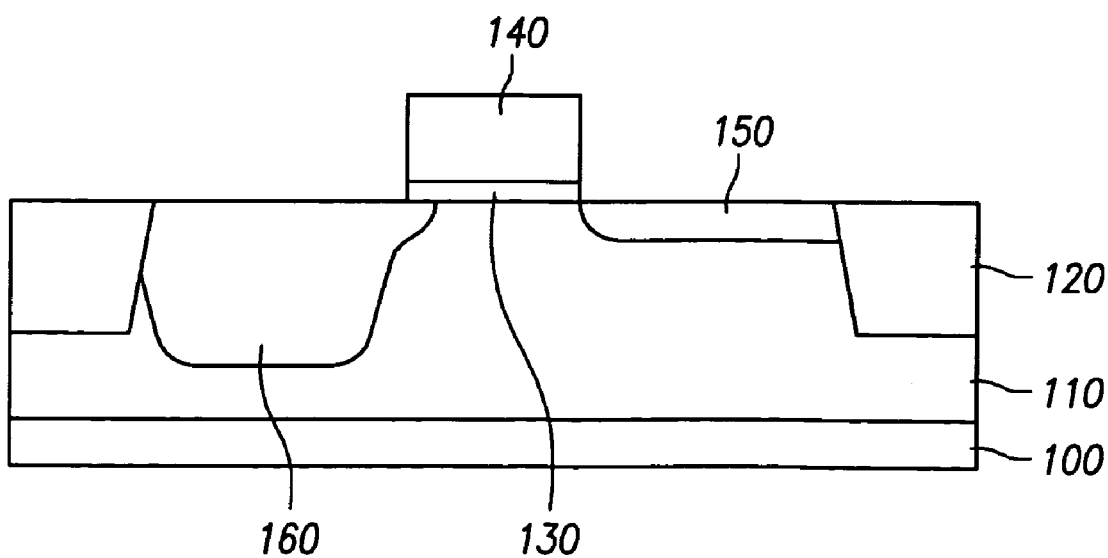
Figure 1C:
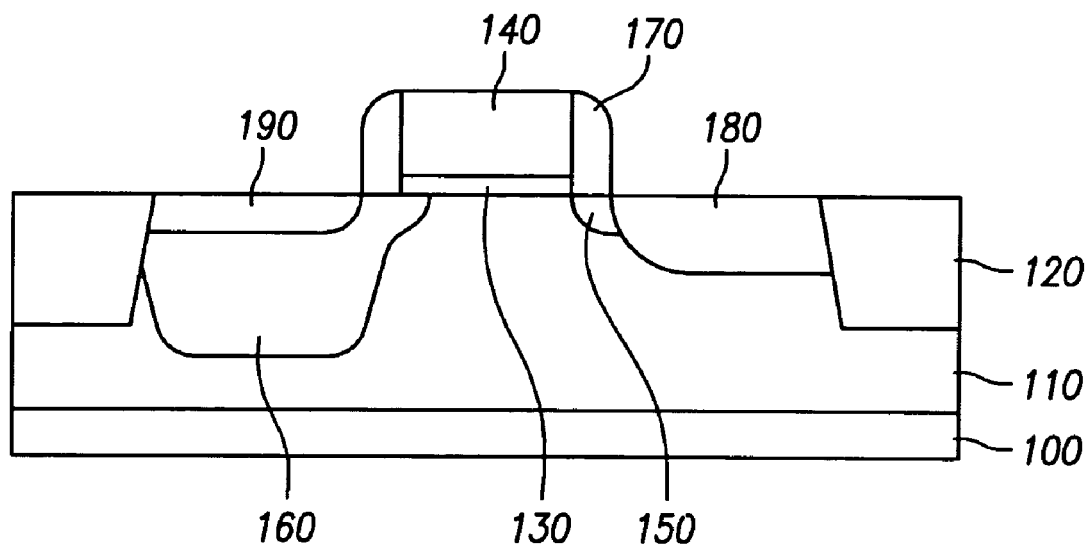
Figure 2A:
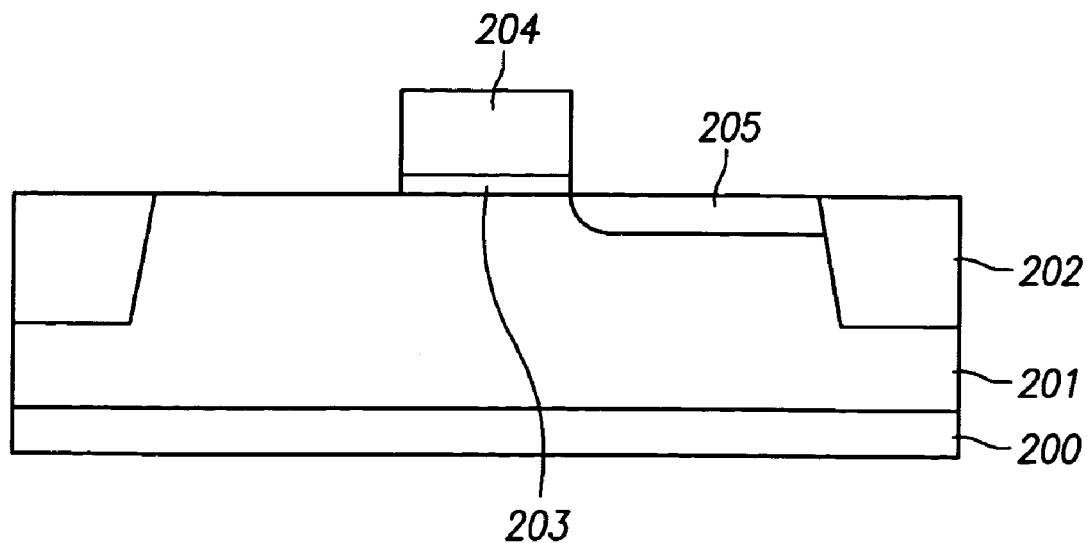
FIGS. 2A to 2C are sectional views showing a CMOS image sensor according to an embodiment of the present invention.
Figure 2B:
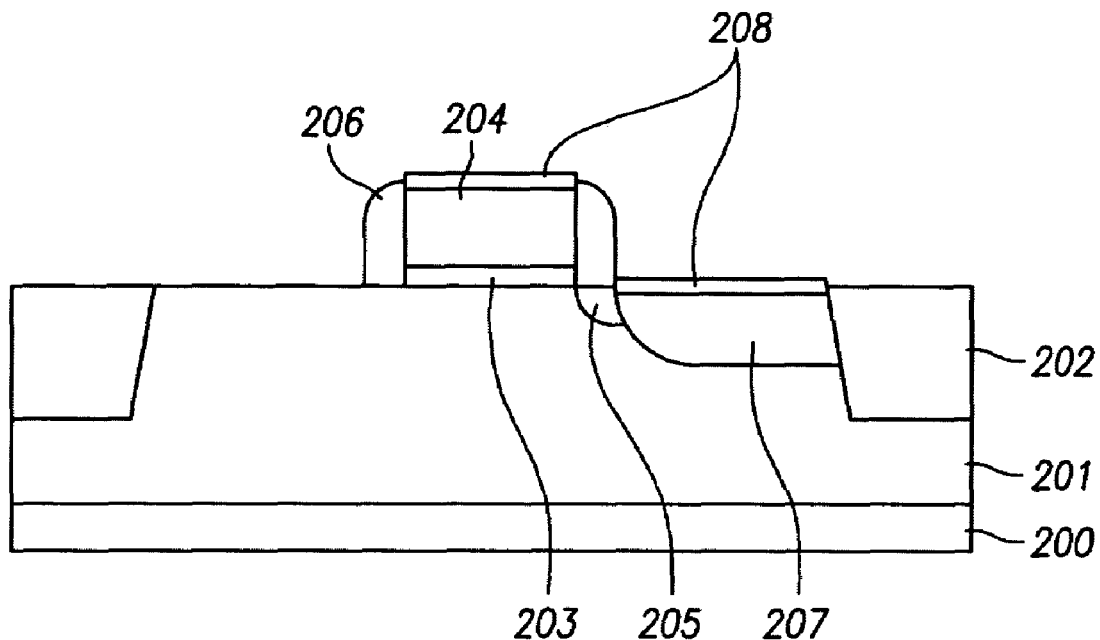
Figure 2C:
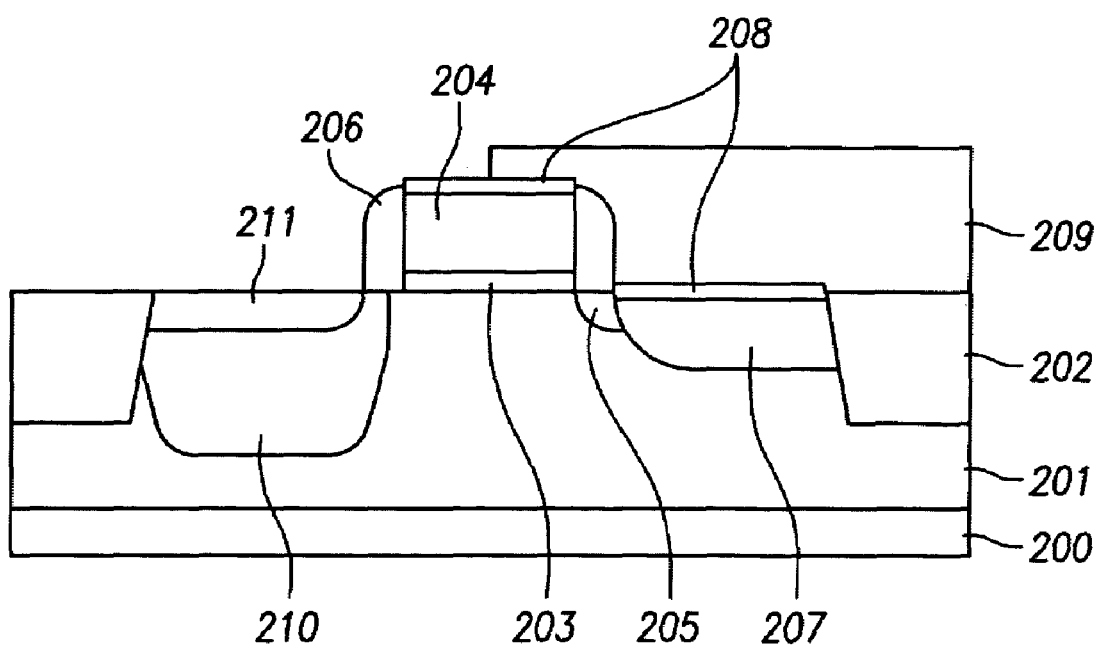

FIGS. 2A to 2C are sectional views showing a CMOS image sensor according to an embodiment of the present invention.

As shown in FIG. 2A, a low-density P type (P-) epitaxial layer 201 is formed on a P type semiconductor substrate 200. Then, a photoresist film (not shown) is coated on the epitaxial layer 201. Thereafter, an exposure and development process is performed with respect to the photoresist film by using a mask defining an active area and an isolation area, thereby forming a photoresist pattern such that only a portion of the epitaxial layer 201 corresponding to the isolation area is exposed. The exposed epitaxial layer 201 is etched by a predetermined depth by using the photoresist pattern as a mask, thereby forming a trench (not shown). Thereafter, the photoresist pattern is removed.

Subsequently, an $O_3$ TEOS film (not shown) is formed on the entire surface of the epitaxial layer 201 such that the $O_3$ TEOS film is filled in the trench, and then a chemical mechanical polishing (CMP) process is performed with respect to the resultant structure such that the $O_3$ TEOS film remains only in the trench, thereby forming an isolation layer 202 in the isolation area.

An insulating layer (not shown) and a conductive layer (not shown) are sequentially formed on the entire surface of the semiconductor substrate formed with the isolation layer 202, and then selectively removed, thereby forming a gate electrode 204 and a gate insulating layer 203.

Subsequently, a photoresist pattern (not shown) is formed such that only a portion of the epitaxial layer 201 corresponding to a source/drain area can be exposed, and low-density N type ions are implanted by using the photoresist pattern as a mask, thereby forming a low-density N type impurity area 205 for lightly doped drain (LDD). Then, the photoresist pattern is removed.

As shown in FIG. 2B, spacers 206 are formed at both sidewalls of the gate insulating layer 203 and the gate electrode 204. The spacer 206 has an oxide/nitride (ON) layer structure or an oxide/nitride/oxide (ONO) layer structure. The spacer 206 may be formed through an etch back process after sequentially forming an oxide layer and a nitride layer (an oxide layer is formed on the nitride layer once more time in the ONO structure) on the entire surface of the semiconductor substrate.

Thereafter, high-density N type ions are implanted into a portion of the semiconductor substrate corresponding to the source/drain area by using the photoresist pattern (not shown), the gate electrode, and the spacer as a mask, thereby forming a high-density N type impurity area 207.

Subsequently, a metal layer (not shown) including tungsten (W) or cobalt (Co) is formed on the entire surface of the semiconductor substrate, and then a thermal process is performed with respect to the resultant structure, such that a salicide layer 208 is formed on an upper surface of the gate electrode 204 and the high-density N type impurity area 207 through a salicide reaction. Then, the remaining metal layer, which is not subject to the salicide reaction, is selectively removed.

As shown in FIG. 2C, a photoresist film (not shown) is deposited on the entire surface of the semiconductor substrate, and a photoresist pattern 209 is formed such that the epitaxial layer 201 formed in the photodiode area and a portion of the salicide layer 208 adjacent to the photodiode area can be exposed through an exposure and development process.

Subsequently, N type dopants are implanted into the resultant structure by using the photoresist pattern 209 and the exposed salicide layer 208 as a mask, and then a diffusion process is performed with respect to the resultant structure, thereby forming an N type impurity diffusion area. The N type dopants are implanted with high energy between 100 KeV to 250 KeV such that the N type dopants can be deeply implanted. At this time, since the salicide layer 208 on the gate electrode, which is used as the mask, serves as an ion implantation barrier, the salicide layer 208 can prevent the implanted ions from being penetration into a lower part of the gate electrode even though the ions are implanted with high energy. As a result, the salicide layer 208 can prevent the occurrence of current leakage of a transistor and the change of a threshold voltage.

Subsequently, P type dopants are implanted in low energy of 100 KeV or less, and a diffusion process is performed, thereby forming a P type impurity diffusion area 211 on the upper part of the N type impurity diffusion area 210. Then, the photoresist pattern 209 is removed.

As described above, a method for manufacturing a CMOS image sensor according to the present invention has a following advantage.

A salicide layer is formed on a gate electrode before a high-energy ion implantation process for forming a photodiode and is used as a high-energy ion implantation barrier, thereby preventing implanted ions from penetrating into a lower part of the gate electrode. As a result, the salicide layer can prevent the occurrence of current leakage of a transistor and the change of a threshold voltage.

While the invention has been shown and described with reference to certain preferred embodiments thereof, it will be understood by those skilled in the art that various changes in form and details may be made therein without departing from the spirit and scope of the invention as defined by the appended claims.

What is claimed:

1. A method for manufacturing a CMOS image sensor, comprising the steps of:
    sequentially forming a gate insulating layer and a gate electrode on a transistor area of a first conductivity type semiconductor substrate including a photodiode area and the transistor area;
    forming spacers at sidewalls of the gate insulating layer and the gate electrode;
    forming a second conductivity type impurity area using the gate insulating layer, the gate electrode and the spacers as a mask, wherein the second conductivity type impurity area corresponds to a source/drain area;
    forming a salicide layer on upper surfaces of the gate electrode and the second conductivity type impurity area; and
    implanting second conductivity type dopants in the photodiode area of the first conductivity type semiconductor substrate after forming the salicide layer to form a photodiode.

2. The method as claimed in claim 1, wherein the step of implanting the second conductivity type dopants includes:
    depositing a photoresist film on an entire surface of the semiconductor surface including the salicide layer;
    patterning the photoresist film to expose the photodiode area of the first conductivity type semiconductor substrate and a portion of the salicide layer adjacent to the photodiode area; and
    implanting the second conductivity type dopants into the exposed photodiode area using the patterned photoresist film and the exposed portion of the salicide layer as a mask.

3. The method as claimed in claim 1, further comprising a step of implanting first conductivity type dopants into the photodiode area of the first conductivity type semiconductor substrate.

4. The method as claimed in claim 3, wherein the first conductivity type dopants are implanted at a first energy, the second conductivity type dopants are implanted at a second energy, and the second energy is higher than the first energy.

5. The method as claimed in claim 3, wherein the first energy is 100 KeV or less, and the second energy is between 100 KeV and 250 KeV.

6. The method as claimed in claim 1, wherein the step of forming the salicide layer includes:
    forming a metal layer on an entire surface of the first conductivity type semiconductor substrate including the gate electrode;
    performing a thermal process to form the salicide layer; and
    removing the metal layer that does not form the salicide layer.

7. The method as claimed in claim 6, wherein the metal layer includes tungsten (W) or cobalt (Co).

8. The method as claimed in claim 1, wherein the first conductivity type dopants include P type dopants, and the second conductivity type dopants include N type dopants.

9. A method for manufacturing a CMOS image sensor, comprising:
    forming a gate electrode on a transistor area of a first conductivity type semiconductor substrate including a photodiode area and the transistor area;
    forming a salicide layer on the gate electrode and a source/drain terminal in the transistor area; and
    implanting a second conductivity type dopant in the photodiode area of the first conductivity type semiconductor substrate after forming the salicide layer to form a photodiode, wherein implanting the second conductivity type dopant includes depositing a photoresist film on an entire surface of the semiconductor surface including the salicide layer, patterning the photoresist film to expose the photodiode area of the first conductivity type semiconductor substrate and a portion of the salicide layer adjacent to the photodiode area; and implanting the second conductivity type dopant into the exposed photodiode area using the patterned photoresist film and the exposed portion of the salicide layer as a mask.

10. The method as claimed in claim 9, further comprising implanting a first conductivity type dopant into the photodiode area of the semiconductor substrate at an energy that is less than a corresponding energy at which the second conductivity type dopants are implanted.

11. The method as claimed in claim 10, wherein the first conductivity type dopant is implanted at a first energy of 100 KeV or less, and the second conductivity type dopant energy is implanted at a second energy between 100 KeV and 250 KeV.

12. The method as claimed in claim 10, further comprising masking the photodiode area prior to forming the metal layer on the first conductivity type semiconductor substrate, then removing the mask after forming the salicide layer.

13. The method as claimed in claim 12, wherein masking the photodiode area comprises depositing a photoresist on the first conductivity type semiconductor substrate, then patterning the photoresist to form the mask over the photodiode area that exposes the gate electrode and the source/drain terminal.

14. The method as claimed in claim 9, wherein the step of forming the salicide layer includes:
    forming a metal layer on an entire surface of the first conductivity type semiconductor substrate including the gate electrode;
    reacting the metal layer with exposed silicon to form the salicide layer; and
    removing the metal layer that does not react with the exposed silicon.

15. The method as claimed in claim 14, wherein the metal layer includes tungsten (W) or cobalt (Co).

16. The method as claimed in claim 9, wherein the first conductivity type dopants include P type dopants, and the second conductivity type dopants include N type dopants.

* * * * *